United States Patent
Konishi et al.

(10) Patent No.: US 7,052,928 B2
(45) Date of Patent: May 30, 2006

(54) SOLID STATE IMAGING DEVICE, METHOD FOR PRODUCING THE SAME, AND PORTABLE ELECTRONIC DEVICE

(75) Inventors: Takefumi Konishi, Hiroshima (JP); Kazuhiro Kawajiri, Kanagawa (JP)

(73) Assignee: Innotech Corporation, Kanagawa (JP)

( * ) Notice: Subject to any disclaimer, the term of this patent is extended or adjusted under 35 U.S.C. 154(b) by 170 days.

(21) Appl. No.: 10/778,655

(22) Filed: Feb. 12, 2004

(65) Prior Publication Data

US 2004/0235261 A1   Nov. 25, 2004

(30) Foreign Application Priority Data

Feb. 12, 2003   (JP)   ............... 2003-033870

(51) Int. Cl.
*H01L 21/00*   (2006.01)
(52) U.S. Cl. .................. 438/57; 438/59; 438/200
(58) Field of Classification Search ............ 438/57, 438/59, 74, 200
See application file for complete search history.

(56) References Cited

U.S. PATENT DOCUMENTS 6,136,629 A * 10/2000 Sin ........................ 438/48
6,512,547 B1 * 1/2003 Miida ..................... 348/310
6,742,022 B1 * 5/2004 King et al. ............... 709/219

FOREIGN PATENT DOCUMENTS

JP   2001-177805   6/2001

* cited by examiner

*Primary Examiner*—Tuan H. Nguyen
(74) *Attorney, Agent, or Firm*—David G. Conlin; Edwards Angell Palmer & Dodge, LLP

(57) ABSTRACT

A method for producing a solid-state imaging device comprising a plurality of unit pixel sections, including a first unit pixel section, is provided. The method includes the steps of forming a first conductivity type well region of the first unit pixel section on a second conductivity type semiconductor layer provided on a first conductivity type semiconductor layer, the first conductivity type well region including a light receiving region for generating charges corresponding to an amount of light incident thereon and a charge transfer region capable of transferring the charges; and generating a charge accumulation region, for accumulating the charges generated in the light receiving region, in the charge transfer region. The step of forming the first conductivity type well region includes the step of implanting impurities such that the light receiving region and the charge transfer region in the first conductivity type well region have a substantially uniform impurity concentration.

6 Claims, 8 Drawing Sheets

SOLID STATE IMAGING DEVICE, METHOD FOR PRODUCING THE SAME, AND PORTABLE ELECTRONIC DEVICE

This non-provisional application claims priority under 35 U.S.C., §119(a), on patent application Ser. No. 2003-033870 filed in Japan on Feb. 12, 2003, the entire contents of which are hereby incorporated by reference.

BACKGROUND OF THE INVENTION

1. Field of the Invention

The present invention relates to a solid-state imaging device, a method for producing the same, and a mobile electronic device including the same. More specifically, the present invention relates to a solid-state imaging device used for video cameras, digital cameras, and camera-equipped cellular phones such as, for example, a threshold voltage modulation system MOS image sensor; a method for producing the same; a mobile electronic device including the same.

2. Description of the Related Art

Semiconductor image sensors such as, for example, CCD-type image sensors and MOS image sensors are easily and effectively mass-produced and are conventionally used as an image input device in mobile electronic devices including video cameras, digital cameras and camera-equipped cellular phones. Since such mobile electronic devices are operated by batteries, it is important to reduce the driving voltage and power consumption. It is also important to reduce production costs and module size. As compared to CCD image sensors, MOS image sensors consume less power and are produced at lower cost using a conventional CMOS process. The MOS image sensors can also be reduced in module size by forming sensor devices and peripherals on one chip. For these reasons, the MOS image sensors now attract attention.

As examples of such MOS image sensors, Japanese Laid-Open Publications Nos. 11-195778, 2001-160620 and 2001-177085 disclose a threshold voltage modulation system MOS image sensor as shown in FIGS. 5 and 6.

FIG. 5 is a plan view showing an exemplary layout of a unit pixel section 210 in a conventional MOS image sensor as disclosed in the above-mentioned publications. FIG. 6 is a cross-sectional view of the unit pixel section 210 taken along line A–A' in FIG. 5. Although not shown, the MOS image sensor includes a plurality of unit pixel sections 210 in a matrix, i.e., in rows and columns.

As shown in FIGS. 5 and 6, the unit pixel section 210 includes a light receiving diode 211 for receiving light and a signal detecting MOS transistor 212 for detecting a signal representing an amount of light received by the light receiving diode 211 and outputting the signal. The light receiving diode 211 is provided adjacent to the MOS transistor 212. As disclosed in, for example, Japanese Laid-Open Publication No. 2002-50753, the unit pixel sections 210 adjacent to each other in a row direction are separated from each other by pixel separation electrodes 213a and 213b. The pixel separation electrodes 213a and 213b are formed in the step of forming a gate electrode.

As shown in FIG. 6, reference numeral 214 refers to a p-type silicon substrate or a p-type epitaxially grown semiconductor layer provided on the silicon substrate (hereinafter, both referred to also as a "p-type layer 214"). In the p-type layer 214, an n-type layer 215 is provided in both an area of the light receiving diode 211 and an area of the MOS translator 212. On the n-type layer 215, a p-type well region 216a is provided in the light receiving diode 211, and a p-type well region 216b is provided in the MOS transistor 212. The p-type well region 216a and the p-type well region 216b are formed by different production steps.

The p-type well region 216a in the light receiving diode 211 acts as a light receiving region for generating charges corresponding to an amount of light incident thereon. In the p-type well region 216b, a carrier pocket region 217 is provided for accumulating the charges generated by the p-type well region 216a. The MOS transistor 212 includes a gate region capable of changing the threshold voltage of a channel region based on the potential, in proportion to the charges accumulated in the carrier pocket region 217. The gate region is formed of the p-type well region 216b. In the light receiving diode 211, an n-type layer 218 is provided below the n-type layer 218. In the MOS transistor 212, a p-type buried layer 219 is provided below the n-type layer 215.

In the light receiving diode 211, an n-type impurity region 220 is provided on a surface of the p-type well region 216a. Thus, a burying structure for burying the charges generated in correspondence with the amount of incident light is provided.

In the MOS transistor 212, an annular gate electrode 222 in provided above the p-type well region 216b with a gate insulating layer 221 interposed therebetween. An n-type source region 223 is provided in a surface region of the p-type well region 216b, below an area surrounded by the gate electrode 222.

An n-type drain region 224 is provided so as to surround the p-type well regions 216a and 216b. The source region 223 is connected to a source electrode 226 via a contact hole 226a. The drain region 224 is connected to a drain electrode 227 via a contact hole 227a. The gate electrode 222 is connected to a gate line (not shown) via a contact hole 228a.

An n-type well separation region 229 is provided below the drain region 224, and the drain region 224 is in contact with the n-type layer 215 via the well separation region 229. An n-type channel dope layer 230 is provided below the gate electrode 222 with the gate insulating layer 221 interposed therebetween. The channel dope layer 230 forms the channel region. The carrier pocket region 217 is provided at a position which is below the channel region, in the p-type well region 216b and in the vicinity of the source region 223. In this specification, the carrier pocket region is also referred to as a charge accumulation region. The charge accumulation region acts as a hole pocket region for accumulating holes and is also referred to as a "hole pocket region". In the hole pocket region 217, holes generated by light irradiation by the light receiving diode 211 are accumulated. A hole is an example of an optical signal carrier. The threshold voltage of the MOS transistor 212 changes in accordance with the amount of the optical signal carriers accumulated in the hole pocket region 217.

Hereinafter, an operation of the MOS image sensor having the above-described structure will be briefly described.

In the MOS image sensor, a series of operations, i.e., an initial operation (a reset operation) to a charge accumulation operation to a signal read operation are performed repeatedly.

In a period of the initial operation, the gate electrode 222, the source electrode 226 and the drain electrode 227 are supplied with a positive high voltage, and holes (optical signal carriers) remaining in the hole pocket region 217 are discharged toward the p-type layer 214.

Next, in a period of the charge accumulation operation, holes newly generated by irradiation of the light receiving diode 211 with light are accumulated in the hole pocket region 217.

In a period of the signal read operation, a signal representing an amount of holes accumulated in the hole pocket region 217 in output from the source region 223.

A method for producing the MOS image censor will be described with reference to FIGS. 7A through 7H.

FIGS. 7A through 7H are cross-sectional views illustrating a production method of the MOS image sensor shown in FIGS. 5 and 6. The cross-sectional views ale along line A–A' in FIG. 5.

As shown in FIG. 7A, a mask pattern layer 231 having an opening at an area where the light receiving diode 211 is to be formed is used to implant n-type impurities into the p-type layer 214, thereby forming the n-type layer 218 in the area where the light receiving diode 211 is to be formed. The p-type well region 216a is also formed so as not to contact the n-type layer 210.

Next, as shown in FIG. 7B, the mask pattern layer 231 is removed and n-type impurities are implanted, thereby forming the n-type layer 215 in the entire planar area at a level in the p-type layer 214. The n-type layer 215 is provided between and in contact with the n-type layer 218 and the p-type well region 216a.

As shown in FIG. 7C, a mask pattern layer 232 having an opening at an area where the MOS transistor 212 is to be formed is used to implant p-type impurities into an area of the p-type layer 214 below the n-type layer 215. The p-type buried layer 219 has a role of fixing the potential of the p-type buried layer 219 to the potential of the p-type layer 214. By this implantation, the p-type buried layer 219 having a higher impurity concentration than that of the n-type layer 215 is formed. The p-type buried layer 219 is adjacent to the n-type layer 218. The mask pattern layer 232 is again used to implant p-type impurities into form the p-type well region 216b on the n-type layer 215. The p-type well region 216b is formed to be aligned with the p-type well region 216a.

As shown in FIG. 7D, a mask pattern layer 233 having an opening which is sufficiently larger than the light receiving diode 211 and also the MOS transistor 212 is used to implant n-type impurities, thereby forming the n-type channel dope layer 230 on a surface of the p-type well region 216a and the p-type well region 216b. The n-type channel dope layer 230 acts as a channel region.

As shown in FIG. 7E, a mask pattern layer 234 having an opening in an area corresponding to an area outside the p-type well region 216a and the p-type well region 216b is used to implant n-type impurities, thereby forming the well separation region 229, which surrounds the p-type well region 216a and the p-type well region 216b.

As shown in FIG. 7F, a mask pattern layer 235 having an opening in an area where the hole pocket region 217 is to be formed is used to implant p-type impurities into the p-type well region 216b. Thus, the hole pocket region 217 having a higher impurity concentration than that of the p-type well region 216b is formed in an annular shape.

After the mask pattern layer 235 is removed, the surface of the resultant laminate is thermally oxidized, thereby forming the gate insulating layer 221 as depicted in FIG. 7G.

As shown in FIG. 7G, the annular gate electrode 222 is formed on the gate insulating layer 221 so as to cover the hole pocket region 217.

As shown in FIG. 7H, the source region 223 is formed in an area surrounded by, and in the vicinity of, the annular hole pocket region 217. The area in which the source region 223 is formed is directly below the area surrounded by the gate electrode 222. The drain region 224 is formed in an area corresponding to an area surrounding the gate electrode 222 and the light receiving diode 211. In addition, n-type impurities are implanted into the n-type channel dope layer 230 to form the n-type impurity region 220.

In this manner, the MOS image sensor including the light receiving diode 211 and the MOS transistor 212 is produced.

The above-described MOS image sensor has the following problems.

The p-type well region 216a included in the light receiving diode 211 is formed using the mask pattern 231, and the p-type well region 216b included in the MOS transistor 212 in formed using the mask pattern 232. Due to the misalignment during the photolithography step, the manner in which the p-type well region 216a and the p-type well region 216b are positioned is variable. The impurity concentration distribution at the interface between the p-type well regions 216a and 216b is unstable. This causes serious variance in the characteristics of charge transfer, by which the optical signal carriers generated in the light receiving diode 211 are transferred to the carrier pocket region 217.

In the NOS image sensor described in Japanese Laid-Open Publication No. 2001-177085, the interface between the p-type well regions 216a and 216b has a higher impurity concentration than that of the p-type well region 216a and 216b. It is explained that this promotes the transfer of the optical signal carriers generated in the p-type well region 216a to the p-type well region 216b, which results in easier transfer of the optical signal carriers to the hole pocket region 217. It is necessary to ensure that the p-type well regions 216a and 216b are positioned uniformly. With the above-described conventional method for producing the MOS image sensor, it is difficult to mass-produce the MOS image sensors in such a uniform state. The present inventors tried to produce the MOS image sensor described in Japanese Laid-Open Publication No. 2001-177085. Rather than the effect of promoting the transfer of the optical signal carriers as described in the publication, the following disadvantages were more conspicuously presented: (i) the optical signal carriers remained at an interface between the p-type well regions 216a and 216b, generating an afterimage, and (ii) the p-type well regions 216a and 216b are substantially separated due to the misalignment, generating a portion having a lower carrier concentration than that of the p-type well regions 216a and 216b, and the optical signal carriers remain in the light receiving diode 211, destabilizing the sensitivity.

There is also a problem of misalignment between the mask pattern layer 231 for determining the position of the light receiving diode 211 and the mask pattern layer 234 for determining the position of the n-type well separation region 229 between adjacent unit pixel sections 210. Exemplary problems are (i) sensitivity variance caused by a change in the planar area of the light receiving diode 211, and (ii) variance in the amount of dark current generated due to the variance in the semiconductor junction profile between the light receiving diode 211 and the n-type well separation region 229.

SUMMARY OF THE INVENTION

According to one aspect of the invention, a method for producing a solid-state imaging device including a plurality of unit pixel sections is provided. The plurality of unit pixel sections including a first unit pixel section. The method comprising the steps of forming a first conductivity type well region of the first unit pixel section on a second conductivity type semiconductor layer provided on a first conductivity type semiconductor layer, the first conductivity type well region including a light receiving region for generating charges corresponding to an amount of light incident thereon and a charge transfer region capable of transferring the charges; and generating a charge accumulation region, for accumulating the charges generated in the light receiving region, in the charge transfer region. The step of forming the first conductivity type well region includes the step of implanting impurities such that the light receiving region and the charge transfer region in the first conductivity type well region have a substantially uniform impurity concentration.

In one embodiment of the invention, the step of forming the charge accumulation region includes the step of implanting impurities such that the charge accumulation region has a higher impurity concentration than the impurity concentration of the first conductivity type well region.

In one embodiment of the invention, the plurality of unit pixel sections further include a second unit pixel section provided adjacent to the first unit pixel section. The step of forming the first conductivity type well region includes the step of defining the first conductivity type well region by forming a well separation region in a border area between the first unit pixel section and the second unit pixel section.

In one embodiment of the invention, the step of defining the first conductivity type well region includes the step of implanting second conductivity type impurities into the well separation region.

In one embodiment of the invention, the step of defining the first conductivity type well region includes the step of forming a field insulating layer in the well separation region by thermal oxidation.

In one embodiment of the invention, the step of defining the first conductivity type well region includes the step of implanting second conductivity type impurities into the well separation region using a mask pattern layer.

According to another aspect of the invention, a solid-state imaging device produced by any of the above methods is provided.

According to still another aspect of the invention, a mobile electronic device includes the above a solid-state imaging device, and a processing section for processing a signal obtained by the solid-state imaging device.

According to still another aspect of the invention, a solid-state imaging device including a plurality of unit pixel sections is provided. At least one of the plurality of unit pixel sections includes a first conductivity type well region provided on a second conductivity type semiconductor layer on a first conductivity type semiconductor layer, the first conductivity type well region including a light receiving region for generating charges corresponding to an amount of light incident thereon and a charge transfer region capable of transferring the charges; and a charge accumulation region provided in the charge transfer region for accumulating the charges generated in the light receiving region. The light receiving region and the charge transfer region in the first conductivity type well region have a substantially uniform impurity concentration.

In one embodiment of the invention, the at least one of the plurality of unit pixel sections further includes a transistor section for outputting a signal corresponding to an amount of the charges accumulated in the charge accumulation region.

According to still another aspect of the invention, a mobile electronic device includes the above solid-state imaging device; and a processing section for processing a signal obtained by the solid-state imaging device.

According to the present invention, the well region in the light receiving region and the well region in the transistor section are formed in the same impurity implantation step. A problem of the conventional method of forming the two well regions using different mask pattern layers that the well regions are positioned in various manners due to misalignment of the mask patterns is avoided. This results in a uniform concentration profile in the entire well region throughout the light receiving region and the transistor section. Therefore, the solid-state imaging devices having a structure for transferring the optical signal carriers generated in the light receiving region to the charge accumulation region without causing the optical signal carriers to remain or to be attenuated in the charge transfer region can be produced in a stable manner.

According to the present invention, the well region is formed for the plurality of unit pixel sections arranged in a row direction and/or a column direction without masking the inter-pixel section border area, and the well region for each unit pixel section is defined by formation of the well separation region. This avoids the problem of the conventional method that the mask pattern layer for forming the well region is positionally misaligned with the mask pattern layer for forming the well separation region. Therefore, the change in the impurity concentration profile caused by the charges being implanted into misaligned regions is prevented.

Thus, the invention described herein makes possible the advantages of providing a solid-state imaging device which is easily and effectively mass-produced owing to the sensitivity variance of the light receiving diode being suppressed and a sufficient margin being guaranteed against misalignment, a method for producing the same, and a mobile electronic device including the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

In the following example, the present invention is applied to a threshold voltage modulation system MOS image sensor. The present invention is not limited to the threshold voltage modulation system MOS image sensor.

Figure 1:
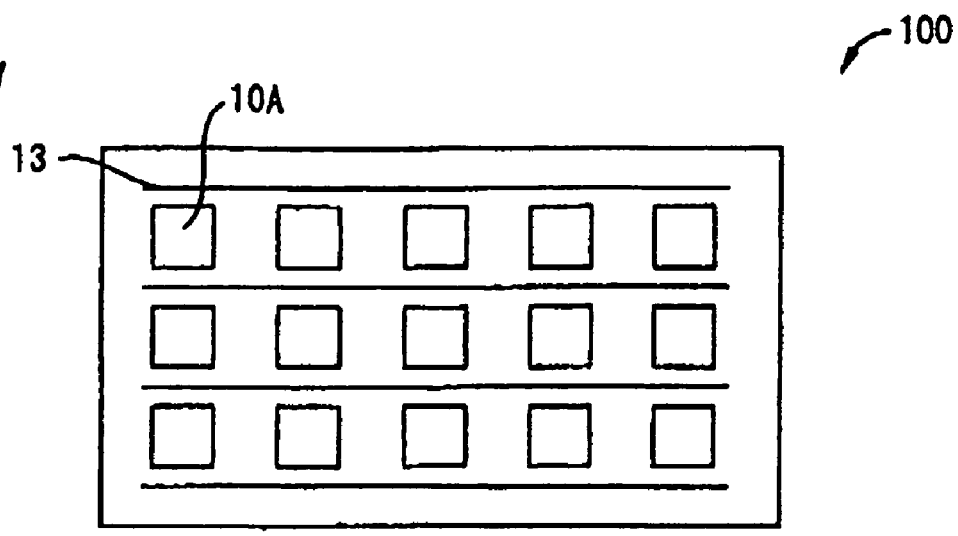
FIG. 1 is a schematic plan view of a solid-state imaging device according to one example of the present invention.

FIG. 1 is a schematic plan view of a solid-state imaging device 100 according to one example of the present invention. The solid-state imaging device 100 acts as a threshold voltage modulation system MOS image sensor.

The solid-state imaging device 100 includes a plurality of unit pixel sections 10A, which are arranged in a matrix, i.e., in rows and columns. The unit pixel sections 10A which are adjacent to each other in a row direction are separated from each other by a plurality of pixel separation electrodes 13.

Figure 2:
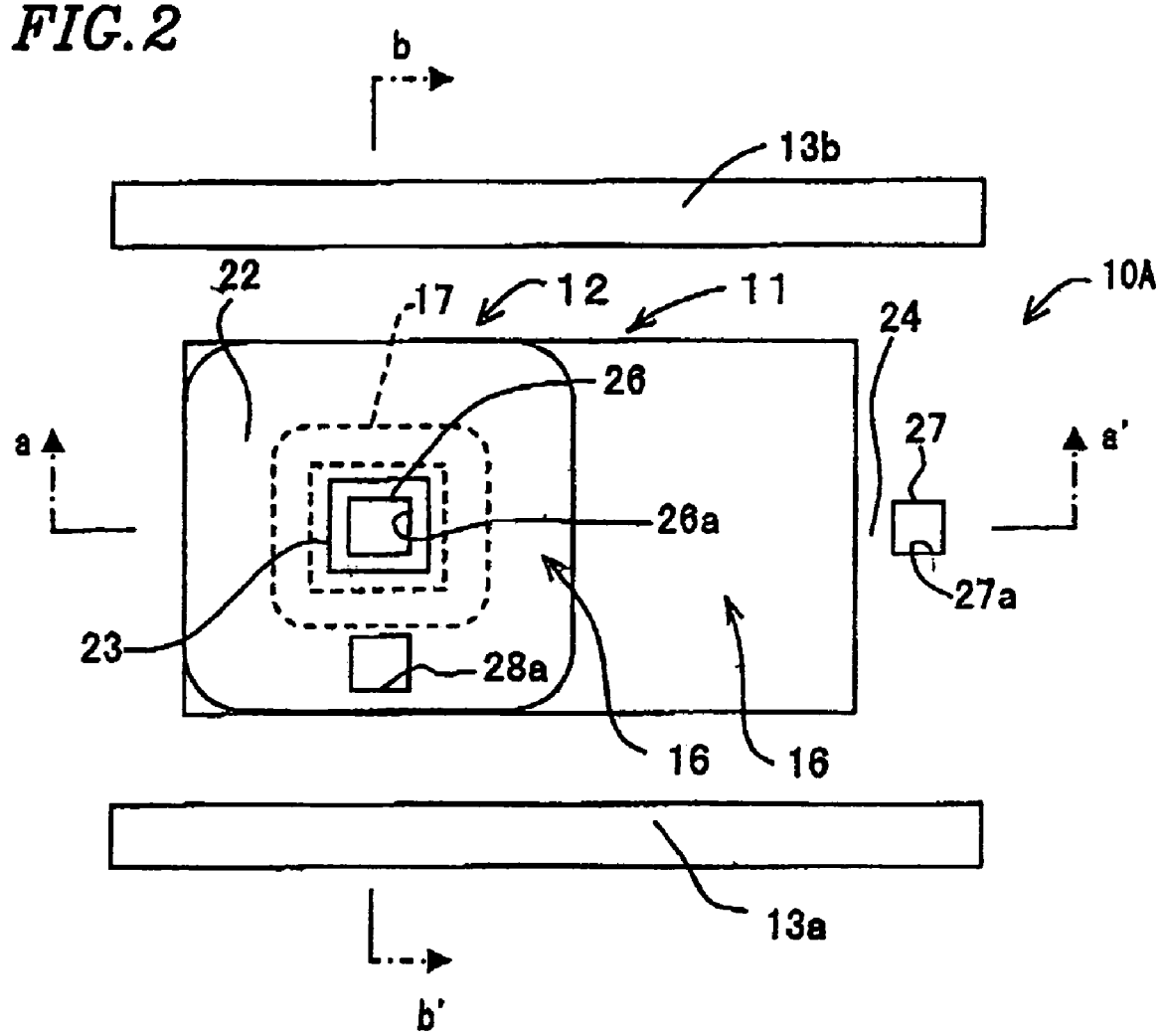
FIG. 2 is a plan view illustrating an exemplary layout of one unit pixel section of the solid-state imaging device shown in FIG. 1.
Figure 3A:
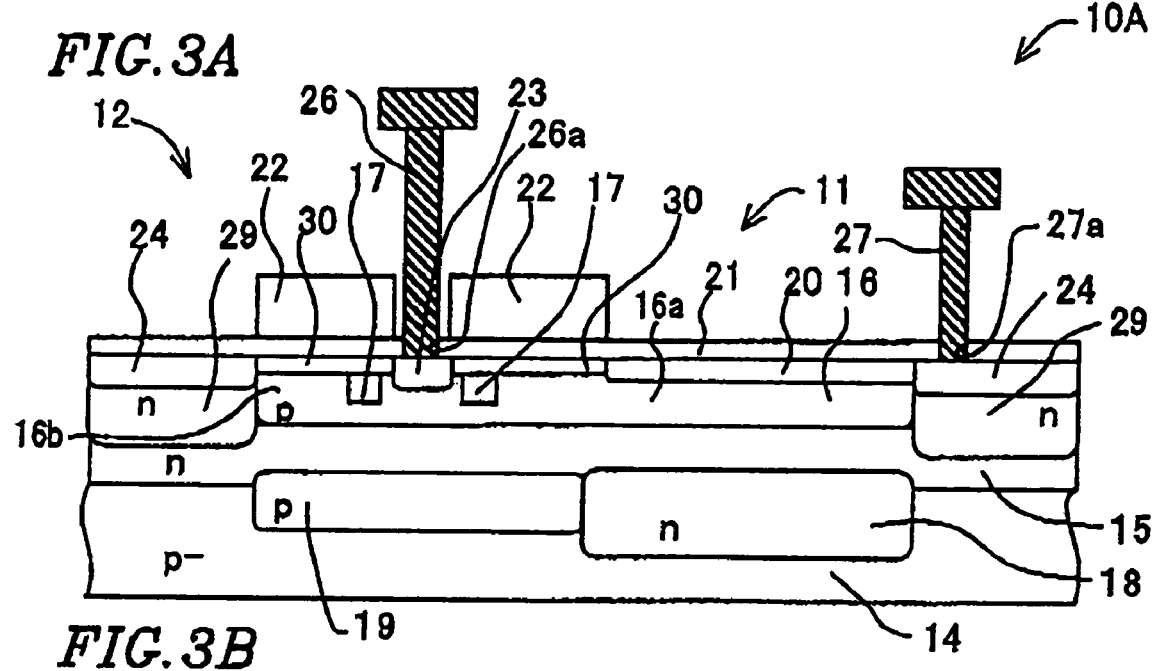
FIG. 3A is a cross-sectional view of the unit pixel section taken along line a–a' in FIG. 2.

FIG. 2 is a plan view illustrating an exemplary layout of one unit pixel section 10A of the solid-state imaging device 100. FIG. 3A is a cross-sectional view of the unit pixel section 10A taken along line a–a' in FIG. 2, and FIG. 3B is a cross-sectional view of the unit pixel section 10A taken along line b–b' in FIG. 2.

Although one unit pixel section 10A will be described below, the other unit pixel sections 10A have the same structure.

The unit pixel section 10A includes a light receiving diode 11 for receiving light and a signal detecting MOS transistor 12 for detecting a signal representing an amount of light received by the light receiving diode 11 and outputting the signal. The light receiving diode 11 is provided adjacent to the MOS transistor 12. As disclosed in, for example, Japanese Laid-Open Publication No. 2002-50753, the unit pixel sections 10A adjacent to each other in the row direction are separated from each other by the pixel separation electrode 13a and 13b. The pixel separation electrode 13a and 13b are formed in the step of forming a gate electrode.

Figure 3B:
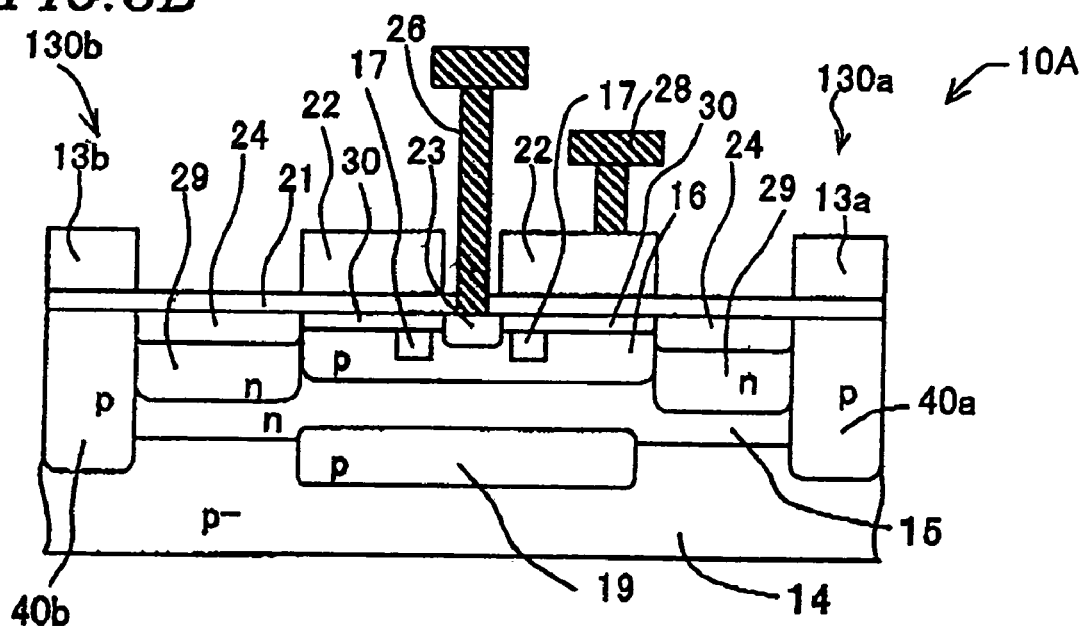
FIG. 3B is a cross-sectional view of the unit pixel section taken along line b–b' in FIG. 2.

In FIGS. 2, 3A and 3B, reference numeral 14 refers to a p-type silicon substrate or a p-type epitaxially grown semiconductor layer provided on the silicon substrate (hereinafter, both referred to also as a "p-type layer 14"). In the p-type layer 14, an n-type layer 15 is provided in both an area of the light receiving diode 11 and an area of the MOS transistor 12. On the n-type layer 15, a p-type well region 16 is provided in both the light receiving diode 11 and the MOS transistor 12. Since the p-type well region 16 is formed both in the light receiving diode 11 and the MOS transistor 12 in one production step using the same mask pattern layer, the entirety of the p-type well region 16 has a uniform impurity concentration. In this specification, the p-type is the first conductivity type and the n-type is the second conductivity type. Alternatively, the first conductivity type may be the n-type, in which case the second conductivity type is the p-type.

The p-type well region 16 is surrounded by and thus defined by a well separation region 29.

The p-type well region 16 includes a light receiving portion 16a for generating charges corresponding to an amount of light incident thereon, and a charge transfer portion 16b capable of transferring the charges generated in the light receiving portion 16a.

In the charge transfer region 16b, a carrier pocket region 17 is provided for accumulating the charges generated by the p-type well region 16a. The MOS transistor 12 includes a gate region capable of changing the threshold voltage of a channel region based on the potential, in proportion to the charges accumulated in the carrier pocket region 17. The gate region is formed of the charge transfer region 16b. In the light receiving diode 11, an n-type layer 18 is provided below the n-type layer 15. In the MOS transistor 12, a p-type buried layer 19 is provided below the n-type layer 15.

In the light receiving diode 11, an n-type impurity region 20 is provided on a surface of the p-type well region 16. Thus, a burying structure for burying the charges generated in correspondence with the amount of incident light is provided.

In the MOS transistor 12, an annular gate electrode 22 is provided above the p-type layer 16 with a gate insulating layer 21 interposed therebetween. An n-type source region 23 is provided in a surface region of the p-type well region 16, below an area surrounded by the gate electrode 22. The source region 23 is connected to a source electrode 26 via a contact hole 26.

An n-type drain region 24 is provided so as to surround the p-type well region 16. The drain region 24 is connected to a drain electrode 27 via a contact hole 27a. The gate electrode 22 is connected to a gate line 28 via a contact hole 28a.

An n-type well separation region 29 is provided below the drain region 24, and the drain region 24 is in contact with the n-type layer 15 via the well separation region 29. An n-type channel dope layer 30 is provided below the gate electrode 22 with the gate insulating layer 21 interposed therebetween. The channel dope layer 30 forms the channel region. The carrier pocket region 17, which is annular, is provided at a position which is below the channel region, in the p-type well region 16 and in the vicinity of the source region 23. In this specification, the carrier pocket region is also referred to as a charge accumulation region. The charge accumulation region acts as a hole pocket region for accumulating holes and is also referred to as a "hole pocket region". In the hole pocket region 17, holes generated by light irradiation by the light receiving diode 11 are accumulated. A hole is an example of an optical signal carrier. The threshold voltage of the MOS transistor 12 changes in accordance with the amount of the optical signal carriers accumulated in the hole pocket region 17.

In order to perform an imaging operation with the solid-state imaging device 100 including a plurality of unit pixel sections 10A arranged in a matrix, i.e., rows and columns, it is necessary to independently control the drain voltages of the unit pixel sections 10A which are adjacent to each other in the row direction or the column direction. In this example, the pixel separation electrodes 13a and 13b are provided between the plurality of unit pixel sections 10A for separating the unit pixel sections 10A. The pixel separation electrodes 13a and 13b are formed in the same step as the formation of the gate electrode 22 of the MOS transistor 12 as described in Japanese Laid-Open Publication No. 2002-50753. The unit pixel sections 10A may be separated from each other using a LOCOS (Local Oxidation of Silicon) element separation structure which is used in a usual MOS process.

Referring to FIG. 3B, each unit pixel section 10A is interposed between pixel separation areas 130a and 130b. The pixel separation areas 130a and 130b respectively include pixel separation portions 40a and 40b, which have a higher p-type impurity concentration than that of the n-type layer 15 or the well separation region 29. The pixel separation portions 40a and 40b each extend from a lower surface of the gate insulating layer 21 toward, and are in contact with, the p-type layer 14. The pixel separation areas 130a and 130b also include the pixel separation electrodes 13a and 13b respectively, which are provided on the pixel separation portions 40a and 40b respectively, with the gate insulating layer 21 interposed therebetween. By keeping the pixel separation electrodes 13a and 13b at the ground potential, the drain voltage of this unit pixel section 10A can be set independently from the drain voltages of the other unit pixels 10A.

Hereinafter, an operation of the solid-state imaging device 100 (MOS image sensor) having the above-described structure will be described.

In the solid-state imaging device 100, a series of operations, i.e., an initial operation (a reset operation) to a charge accumulation operation to a signal read operation are performed repeatedly.

In a period of the initial operation, the gate electrode 22, the source electrode 26 and the drain electrode 27 are supplied with a positive high voltage of, for example, 7 V to 8 V, and holes (optical signal carriers) remaining in the hole pocket region 17 are discharged toward the p-type layer 14.

Next, in the period of the charge accumulation operation, holes newly generated by irradiation of the light receiving diode 11 with light are transferred through the p-type well region 16 and accumulated in the hole pocket region 17 below the gate electrode 22.

In a period of the signal read operation, a signal representing an amount of optical signal carriers accumulated in the hole pocket region 17 is output from the source electrode 26.

A method for producing the solid-state imaging device 100 will be described with reference to FIGS. 4A through 4G.

FIGS. 4A through 4G are cross-sectional views illustrating a production method of the solid-state imaging device 100 shown in FIGS. 2, 3A and 3B. The cross-sectional views are along line a–a' in FIG. 5.

Figure 4A:
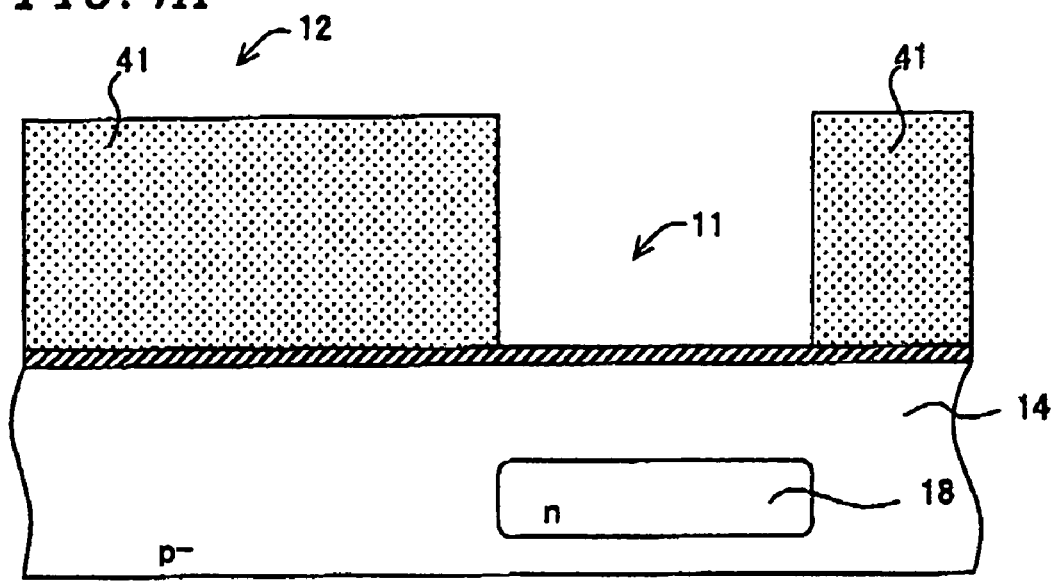
FIGS. 4A through 4G are cross-sectional views illustrating a production method of the solid-state imaging device shown in FIGS. 2, 3A and 3B.
Figure 5:
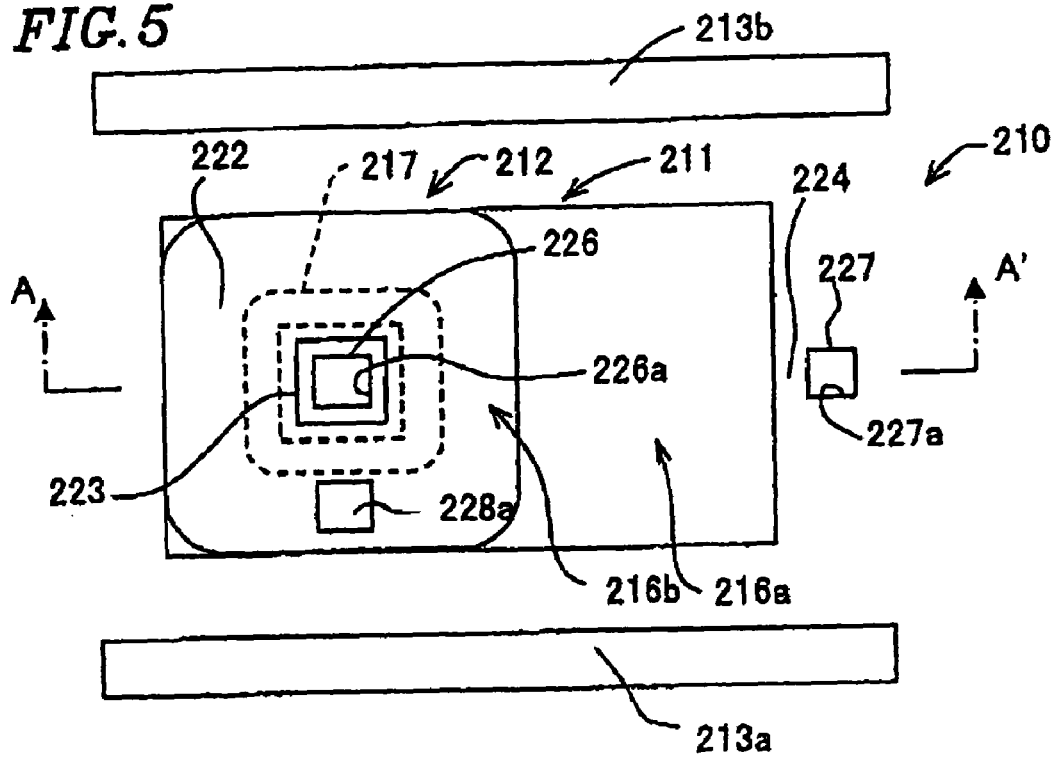
FIG. 5 is a plan view illustrating an exemplary layout of a unit pixel section in a conventional MOS image sensor.
Figure 6:
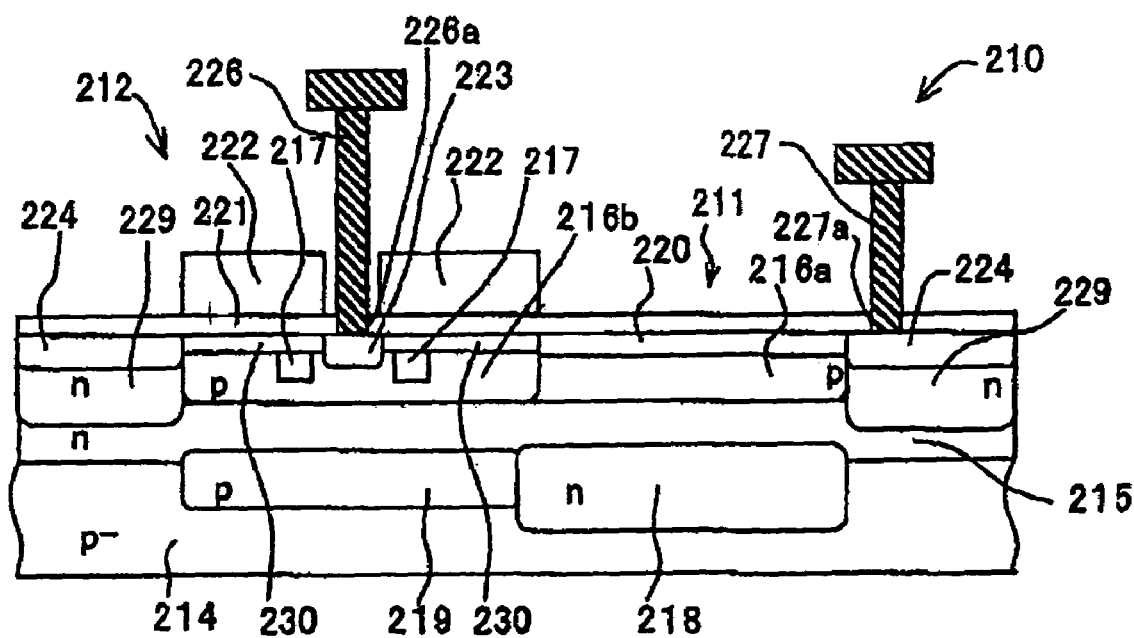
FIG. 6 is a cross-sectional view of the unit pixel section taken along line A–A' in FIG. 5.

As shown in FIG. 4A, a mask pattern layer 41 having an opening at an area where the light receiving diode 11 is to be formed is used to implant n-type impurities into a p-type layer 14 having an impurity concentration of about $1 \times 10^{15}$ cm$^{-3}$, thereby forming the n-type layer 18 in the area where the light receiving diode 11 is to be formed. The n-type layer 18 has a peak position of about 1.5 µm and a peak impurity concentration of about $1 \times 10^{17}$ cm$^{-3}$.

Figure 4B:
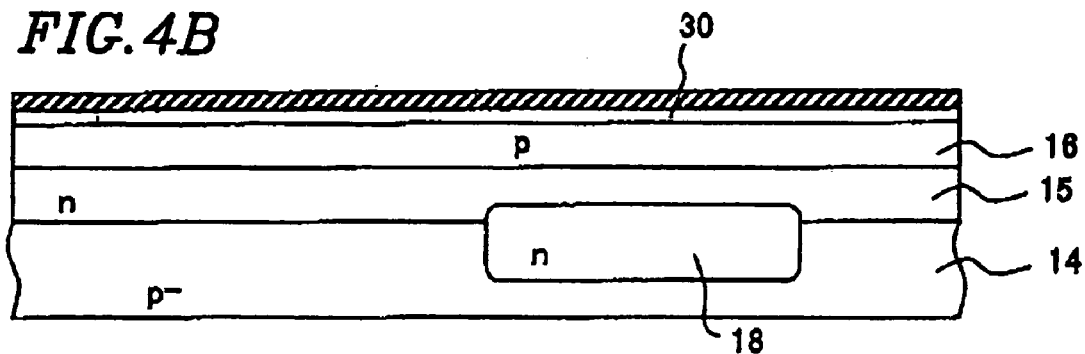

Next, as shown in FIG. 4B, the mask pattern layer 41 is removed and n-type impurities are implanted, thereby forming the n-type layer 15 in the entire planar area at a level in the p-type layer 14. The n-type layer 13 is provided on, and in contact with, the n-type layer 18. The n-type layer 15 has a peak position of about 0.7 µm and a peak impurity concentration of about $3 \times 10^{16}$ cm$^{-3}$.

Although not shown, in the case where the pixel separation regions 130a and 130b (FIG. 3B) are to be formed, a mask pattern is provided at positions where the pixel separation portions 40a and 40b are to be formed, and p-type impurities are implanted, thereby forming the p-type well region 16 on, and in contact with, the n-type layer 15. Then, n-type impurities are implanted, thereby forming the n-type channel dope layer 30 on a surface of the p-type layer 16. In this manner, the position of the p-type well region 16 may be defined by providing the mask pattern at positions where the pixel separation portions 40a and 40b are to be formed.

Alternatively, the unit pixel sections 10A may be separated from each other using a LOCOS element separation method which uses a thick oxide layer (not shown) in the pixel separation regions 130a and 130b.

When the LOCOS element separation method is used, the position of the p-type well region 16 is defined by forming field insulating layers as the pixel separation portions 40a and 40b in the pixel separation regions 130a and 130b by thermal oxidation. Then, like in FIG. 4B, p-type impurities are implanted with no mask layer, thereby forming the p-type well region 16 having a peak position of 0.4 µm and a peak impurity concentration of about $6 \times 10^{16}$ cm$^{-3}$. The p-type well region 16 is formed on a surface of the n-type layer 15. Then, n-type impurities having a peak impurity concentration of about $2 \times 10^{17}$ cm$^{-3}$ are implanted, thereby forming the n-type channel dope layer 30 on a surface of the p-type well region 16.

When the LOCOS element separation method is used, the n-type impurities are implanted only into the surface area of the resultant laminate. Therefore, the n-type impurities are implanted only into the oxide layer (pixel separation portions 40a and 40b) in the pixel separation regions 130a and 130b. Thus, formation of an inverse layer on a surface of the resultant laminate can be fully prevented. It is not necessary to use the mask pattern layer 233 (FIG. 7D) used in the conventional method for forming the channel dope layer 230. This results in simplification of the production method without spoiling the characteristics of the solid-state imaging device 100.

Alternatively, the position of the p-type well region 16 may be defined by forming the pixel separation portions 40a and 40b in the pixel separation regions 130a and 130b, such that a surface-side area of the pixel separation portions 40a and 40b has a sufficiently higher concentration than that of the n-type channel dope layer 30. In this case also, as shown in FIG. 4B, p-type impurities are implanted into the entirety of the resultant laminate to form the p-type layer 16, and the n-type impurities are implanted to form the n-type channel dope layer 30, after the n-type layer 15 in formed. Again, it is not necessary to use the mask pattern layer 233 (FIG. 7D) used in the conventional method for forming the channel dope layer 230. This results in simplification of the production method without spoiling the characteristics of the solid-state imaging device 100.

Figure 4C:
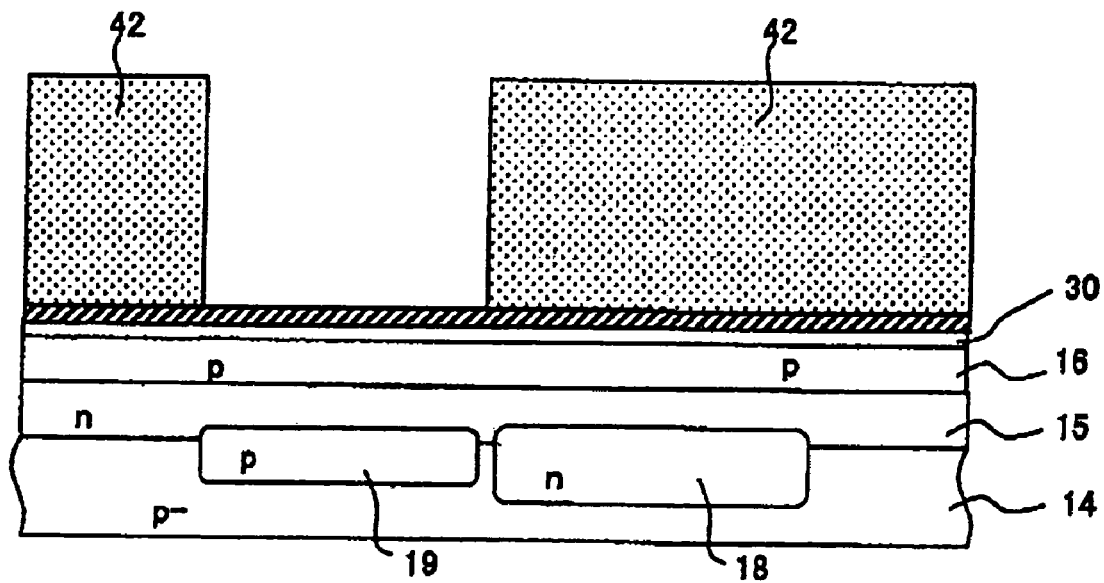

Now, with reference to FIG. 4C, the method for producing the solid-state imaging device 100 will be continued. As shown in FIG. 4C, a mask pattern layer 42 having an opening at an area where the MOS transistor 12 is to be formed is used to implant p-type impurities into an area of the p-type layer 14 below the n-type layer 15. By this implantation, the p-type buried layer 19 having a higher impurity concentration than that of the n-type layer 15 is formed. The p-type buried layer 19 has a peak position of about 1.2 µm and a peak impurity concentration of about $5 \times 10^{16}$ cm$^{-3}$. The p-type buried layer 19 has a role of fixing the potential of the p-type buried layer 19 to the potential of the p-type layer 14 in order to discharge the optical signal carriers accumulated in the carrier pocket region 17 toward the p-type layer 14 in an initial period of the imaging operation. Thus, the p-type buried layer 19 is formed to have a size to cover the carrier pocket region 17.

Figure 7A:
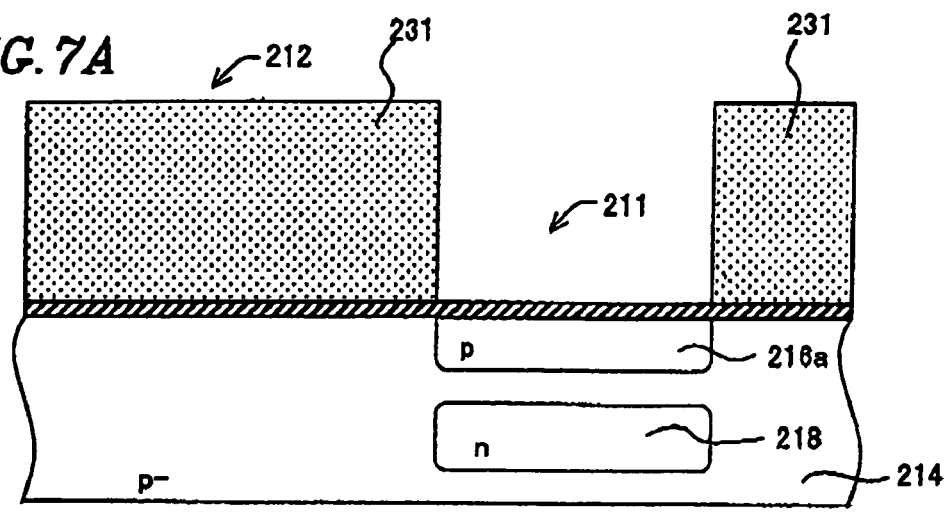
FIGS. 7A through 7H are cross-sectional views illustrating a production method of the MOS image sensor shown in FIGS. 5 and 6.
Figure 7B:
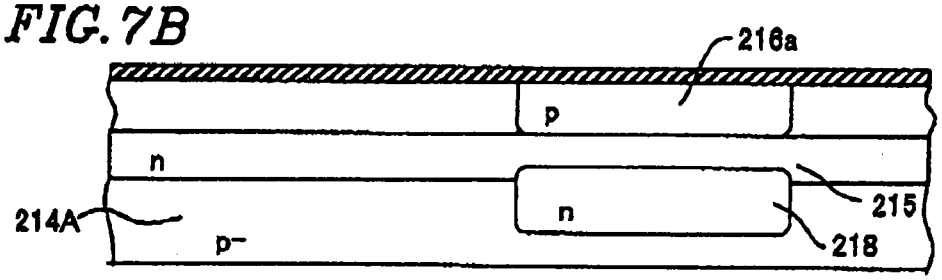
Figure 7C:
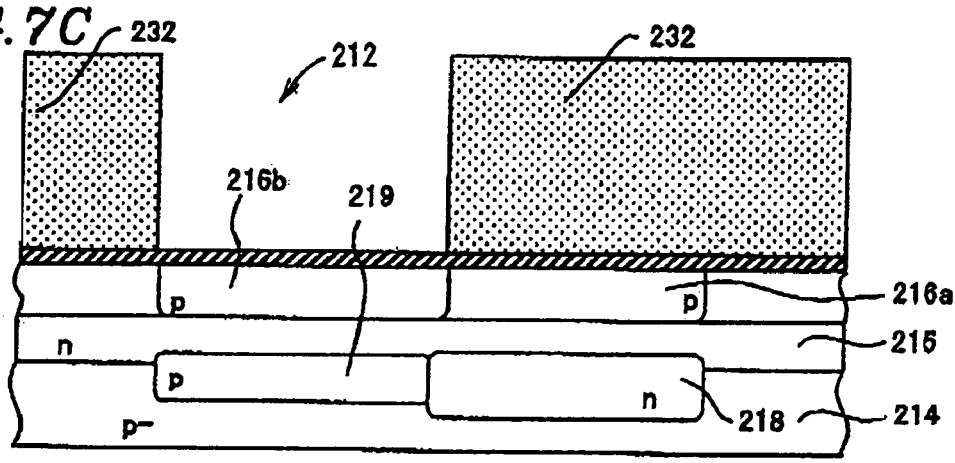
Figure 7D:
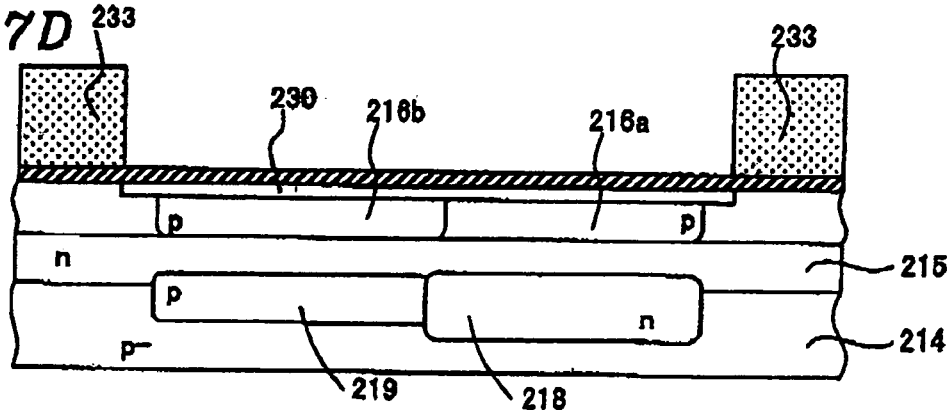
Figure 7E:
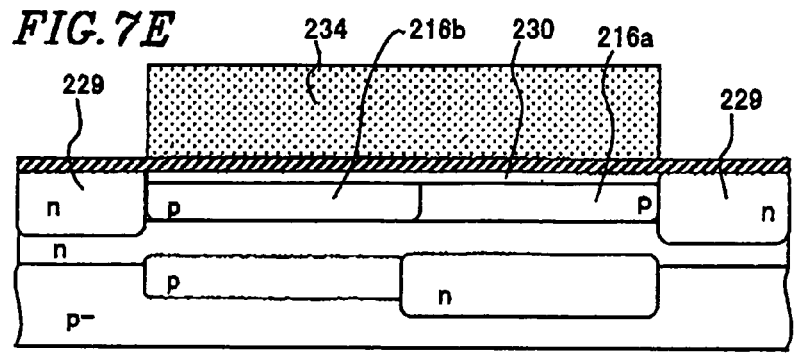
Figure 7F:
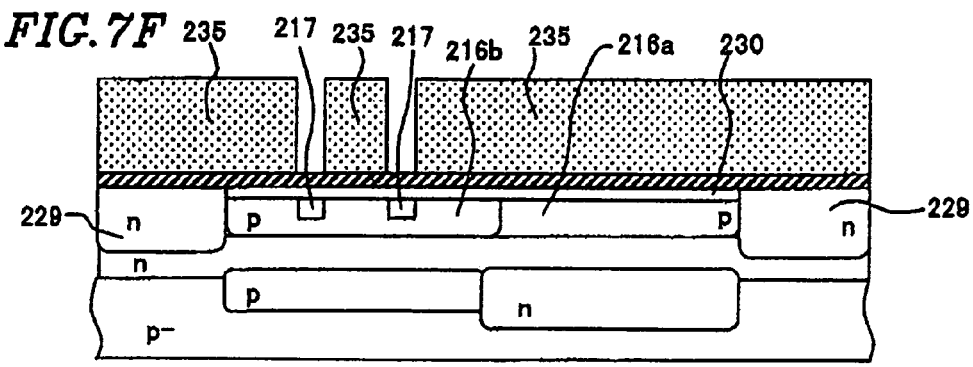
Figure 7G:
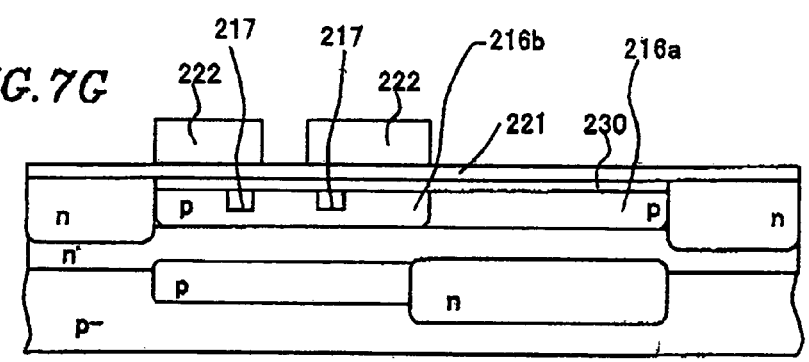
Figure 7H:
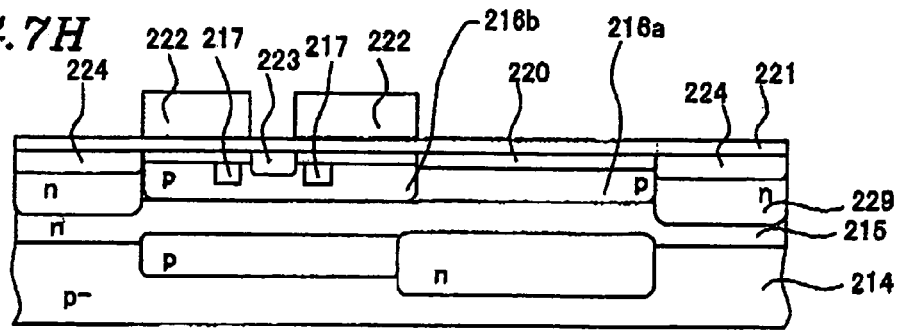

In the conventional method shown in FIG. 7C, it is necessary that the mask pattern layer 232 has an opening which is larger than the gate electrode 222 in order to align the p-type well region 216a of the light receiving diode 211 and the p-type well region 216b of the MOS transistor 212. This causes the n-type layer 215 to have an unnecessarily low impurity concentration in a portion which is included in the light receiving diode 211 and is close to the MOS transistor 212. As a result, the p-type well region 216a in the light receiving diode 211 is completely depleted and has a potential lower than that of the substrate potential after the initial period of the imaging operation. Thus, holes generated by the thermal excitation in the unit pixel section 10A are transferred to the p-type well region 216a. This may cause dark current noise.

In the example of the present invention, by contrast, the mask pattern layer 42 can be provided with an opening having an optimum pattern for the p-type buried layer 19. Thus, the dark current noise can be reduced.

Figure 4D:
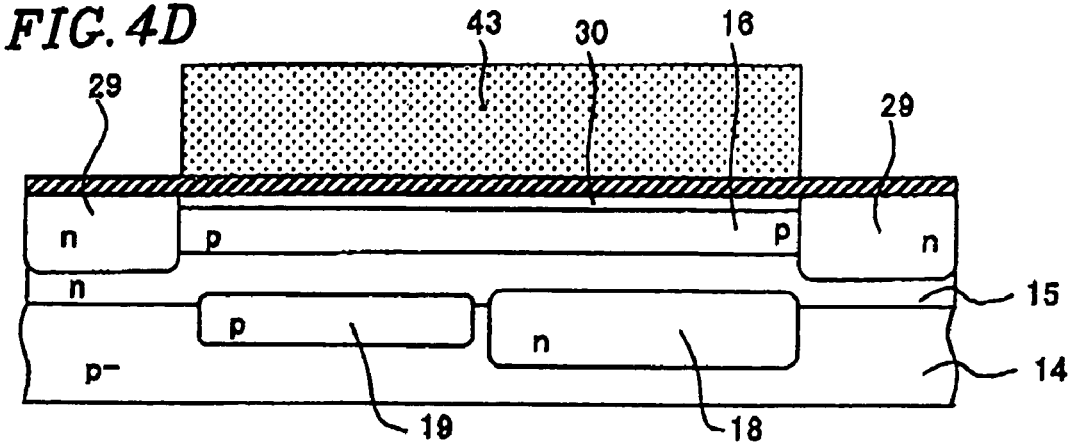

As shown in FIG. 4D, a mask pattern layer 43 having an opening in an area corresponding to an area outside the p-type well region 16 is used to implant n-type impurities, thereby forming the well separation region 29, which surrounds the p-type wall region 16. The well separation region 29 has a peak position of about 0.7 µm and a peak impurity concentration of about $8 \times 10^{16}$ cm$^{-3}$. The well separation region 29 separates the p-type well region 16 into portions corresponding to the plurality of unit pixel sections 10A, and sets the planar area of the light receiving diode 11 to a prescribed size. The planar area of the light receiving diode 11 determines the sensitivity of the solid-state imaging device 100 for optical signals.

Figure 4E:
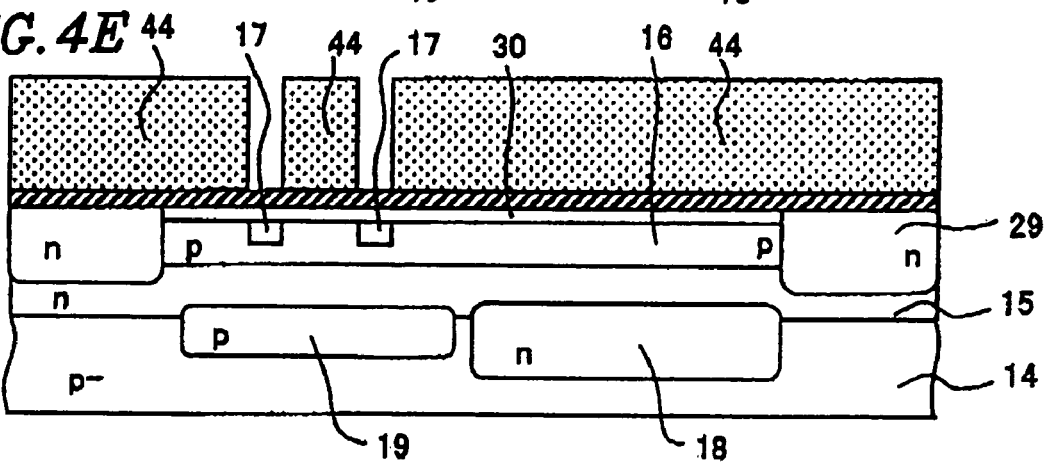

As shown in FIG. 4E, a mask pattern layer 44 having an opening in an area where the hole pocket region 17 is to be formed is used to implant p-type impurities into the charge transfer portion 16b in the p-type well region 16 included in the MOS transistor 12. Thus, the hole pocket region 17 having a higher impurity concentration than that of the p-type well region 16 is formed in an annular shape. The hole pocket region 17 has a peak position of about 0.15 µm and a peak impurity concentration of about $1.4 \times 10^{17}$ cm$^{-3}$.

Figure 4F:
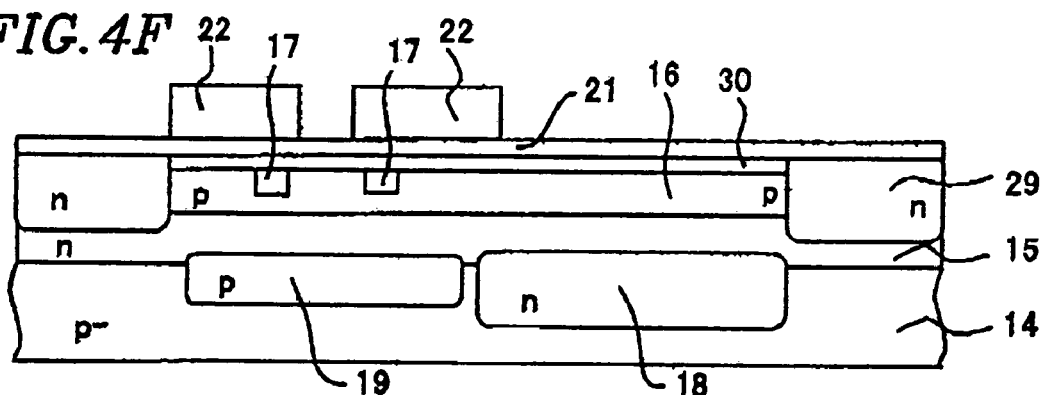

After the mask pattern layer 44 is removed, the surface of the resultant laminate is thermally oxidized, thereby forming the gate insulating layer 21 as shown in FIG. 4F. The annular gate electrode 22 is formed on the gate insulating layer 21 so as to cover the hole pocket region 17.

Figure 4G:
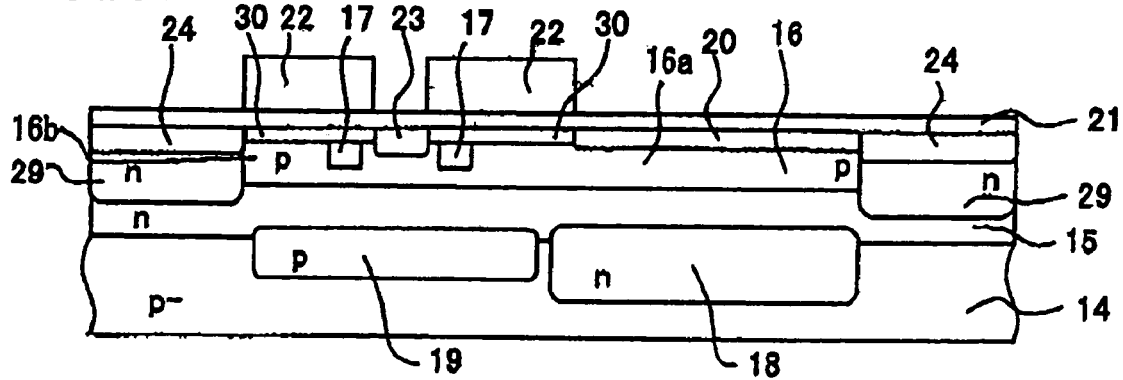

As shown in FIG. 4G, the source region 23 is formed in an area surrounded by, and in the vicinity of, the annular hole pocket region 17. The area in which the source region 23 is formed is directly below the area surrounded by the gate electrode 22, and in an upper portion of the p-type well region 16. The drain region 24 is formed in an area corresponding to an area surrounding the gate electrode 22 and the light receiving diode 11, and n-type impurities are implanted into the n-type channel dope layer 30 to form the n-type impurity region 20. The drain region 24 is formed at the same level as a top portion of the p-type well region 16, and the n-type impurity region 20 is formed on the p-type well region 16. The n-type impurity region 20 in formed in the area corresponding to the light receiving diode 11.

In this manner, the solid-state imaging device 100 in this example is produced. The p-type well region of the light receiving diode 11 and the p-type well region of the MOS transistor 12 are formed in the same impurity implantation process, as the p-type well region 16. Therefore, the p-type well region 16 has a uniform impurity concentration in an area extending from the light receiving diode 11, where the incident light is processed with photo-electric conversion, to immediately before the carrier pocket region (charge accumulation region) 17. The p-type well region 16 does not have a non-uniform impurity concentration profile, in contrast to the conventional solid-state imaging device. This can suppress the problems of the conventional solid-state imaging device such as an afterimage or sensitivity variance which are caused by the non-uniform impurity concentration profile when the optical signal carriers generated in the light receiving diode 11 is transferred to the carrier pocket region 17.

According to the solid-state imaging device 100 in this example, the position of the p-type region 16 can be defined by a single photolithography step of forming the mask pattern layer 43 used for forming the well separation region 29. This avoids the pattern misalignment due to use of a plurality of mask pattern layers and the non-uniform impurity concentration profile due to misalignment of areas in which impurities are implanted. Thus, the solid-state imaging device 100 is easily and effectively mass-produced.

The solid-state imaging device 100 may be used for a mobile electronic device.

Figure 8:
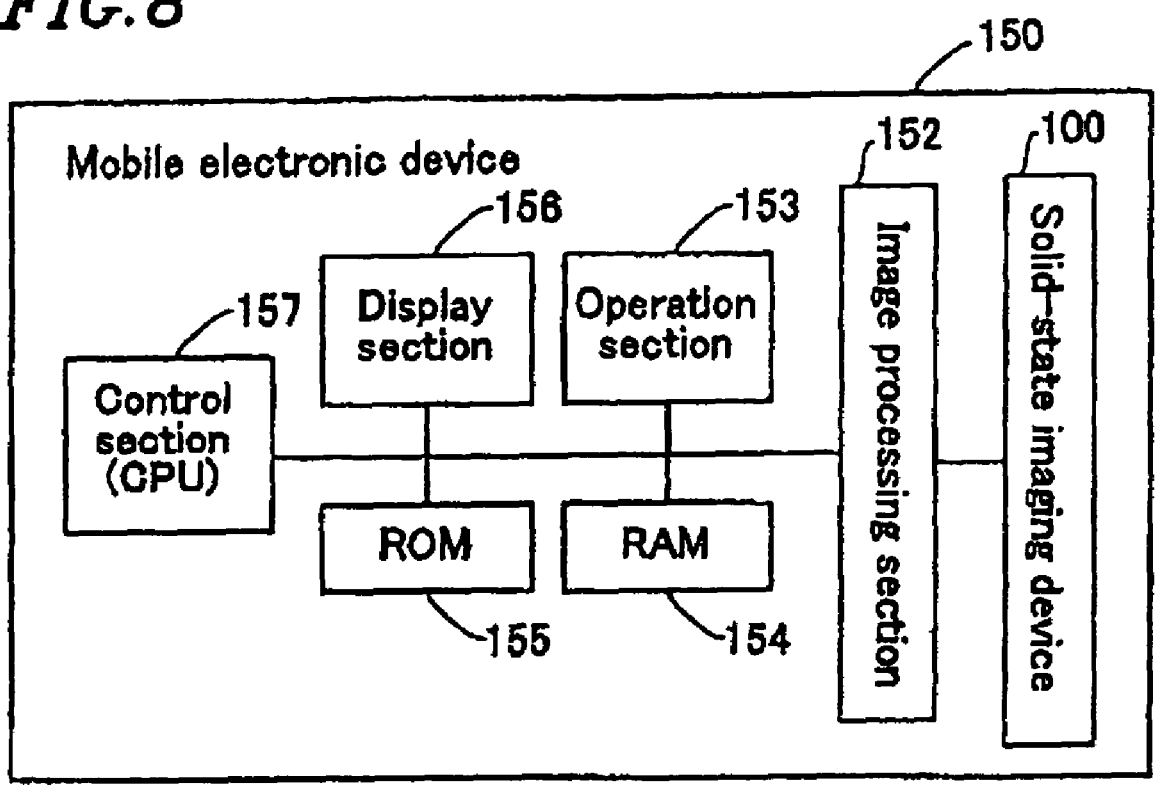
FIG. 8 is a block diagram of a mobile electronic device according to the present invention.

FIG. 8 is a block diagram of a mobile electronic device 150 according to the present invention.

The mobile electronic device 150 includes the solid-state imaging device 100, an image processing section 152 for processing an image signal obtained by the solid-state imaging device 100, an operation section 153 for receiving instructions which are input by a user, a RAM 154 acting as a working memory, a ROM 155 acting as a program memory, a display section 156 for displaying the image, and a control section 157 for controlling the image processing section 152, the operation section 153, the RAM 154, the ROM 155, and the display section 156. The control section 157 includes a CPU (central processing unit).

The mobile electronic device 150 may include a communication section (not shown) for communicating the image.

The control section 157 controls the display section 156 to display an image based on an instruction from the operation section 153 or controls the communication section to communicate the image to another device. The ROM 155 and the RAM 154 store a control program and data. The control section 157 controls the image processing section 152 and the display section 156 based on the control program and the data.

According to the present invention, the well region in the light receiving diode and the well region in the MOS transistor are formed in the some impurity implantation step. Therefore, the well regions can have a uniform impurity concentration profile. Thus, there occurs a potential difference between the drain region of a transistor section which is in the vicinity of the light receiving region, and the charge accumulation region which is in the vicinity of the source region of the transistor section and has a high concentration. This forms a smooth potential gradient for transferring carriers from the light receiving region to the charge accumulation region. Therefore, the optical signal carriers generated in the light receiving region can be smoothly transferred to the carrier pocket region with no obstruction, unlike in the conventional solid-state imaging device. Thus, the optical signal carriers can contribute to the signal detection without remaining between the light receiving region and the charge accumulation region. This is effective for suppressing sensitivity variance among the unit pixel sections, especially where the amount of generated optical signal carriers is small due to the low luminance. This improves the characteristics of the solid-state imaging device.

According to the present invention, the mask pattern layer conventionally required for forming a channel dope layer when the n-type layer and the p-type well region in the light receiving region are formed using the same mask pattern. This reduces the number of production steps.

According to the present invention, the well region in the light receiving diode and the well region in the MOS transistor are formed in the same step using the same mask pattern. Therefore, the problems of the conventional solid-state imaging device, such as generation of a potential barrier or potential drop due to misalignment when the well regions are formed using different mask pattern layers, can be suppressed. Also according to the present invention, the well region is formed for the plurality of unit pixel sections without masking the inter-pixel section border area, and the well region for each unit pixel section is defined by formation of the well separation regions. This can reduce the number of mask pattern layers. Thus, characteristic variance caused by variance of various factors during production is suppressed, which allows for stable production of solid-state imaging devices without requiring strict management of the production steps.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a solid-state imaging device including a plurality of unit pixel sections, the plurality of unit pixel sections including a first unit pixel section; the method comprising the steps of:

forming a first conductivity type well region of the first unit pixel section on a second conductivity type semiconductor layer provided on a first conductivity type semiconductor layer, the first conductivity type well region including a light receiving region for generating charges corresponding to an amount of light incident thereon and a charge transfer region capable of transferring the charges; and generating a charge accumulation region, for accumulating the charges generated in the light receiving region, in the charge transfer region;

wherein the step of forming the first conductivity type well region includes the step of implanting impurities such that the light receiving region and the charge transfer region in the first conductivity type well region have a substantially uniform impurity concentration.

2. A method according to claim 1, wherein the step of forming the charge accumulation region includes the step of implanting impurities such that the charge accumulation region has a higher impurity concentration than the impurity concentration of the first conductivity type well region.

3. A method according to claim 1, wherein:

the plurality of unit pixel sections further include a second unit pixel section provided adjacent to the first unit pixel section; and the step of forming the first conductivity type well region includes the step of defining the first conductivity type well region by forming a well separation region in a border area between the first unit pixel section and the second unit pixel section.

4. A method according to claim 3, wherein the step of defining the first conductivity type well region includes the step of implanting second conductivity type impurities into the well separation region.

5. A method according to claim 3, wherein the step of defining the first conductivity type well region includes the step of forming a field insulating layer in the well separation region by thermal oxidation.

6. A method according to claim 3, wherein the step of defining the first conductivity type well region includes the step of implanting second conductivity type impurities into the well separation region using a mask pattern layer.

* * * * *

UNITED STATES PATENT AND TRADEMARK OFFICE
CERTIFICATE OF CORRECTION

| | |
|---|---|
| PATENT NO. | : 7,052,928 B2 |
| APPLICATION NO. | : 10/778655 |
| DATED | : May 30, 2006 |
| INVENTOR(S) | : Takefumi Konishi et al. |

It is certified that error appears in the above-identified patent and that said Letters Patent is hereby corrected as shown below:

On the Title Page item 73, under "Assignee:", please insert

--Sharp Kabushiki Kaisha, Osaka (JP)-- as a second Assignee.

Signed and Sealed this

Twenty-fourth Day of July, 2007

JON W. DUDAS
*Director of the United States Patent and Trademark Office*